United States Patent [19]

Hoepfner

[11] 4,092,210
[45] May 30, 1978

[54] PROCESS FOR THE PRODUCTION OF ETCHED STRUCTURES IN A SURFACE OF A SOLID BODY BY IONIC ETCHING

[75] Inventor: Joachim Hoepfner, Planegg, Germany

[73] Assignee: Siemens Aktiengesellschaft, Berlin & Munich, Germany

[21] Appl. No.: 705,785

[22] Filed: Jul. 16, 1976

[30] Foreign Application Priority Data

Aug. 18, 1975 Germany ............................. 2536718

[51] Int. Cl.² ....................... B44C 1/22; C03C 15/00; C03C 25/06; C23F 1/02
[52] U.S. Cl. .................................. 156/643; 156/646; 156/656; 156/657; 156/661; 204/192 E
[58] Field of Search ................... 204/192 EC, 192 E; 219/121 EB, 121 P, 121 L; 156/8, 11, 13, 17, 18, 643, 646, 661, 656, 657, 653, 664–666

[56] References Cited

U.S. PATENT DOCUMENTS

| 3,880,684 | 4/1975 | Abe ............................................. 156/8 |
| 3,975,252 | 8/1976 | Fraser et al. ........................... 204/192 |
| 3,984,300 | 10/1976 | Van Ommeren ................. 204/192 E |
| 3,986,912 | 10/1976 | Alcorn et al. ............................ 156/11 |

Primary Examiner—William A. Powell
Attorney, Agent, or Firm—Hill, Gross, Simpson, Van Santen, Steadman, Chiara & Simpson

[57] ABSTRACT

A process for producing an etched structure in a surface of a solid body by providing a mask on the surface of the solid body to expose the desired portions of the surface, ionic etching the mask and the exposed surface with the material of the mask and the material of the solid body being disintegrated and removed by the ion bombardment of the ionic etching characterized by the disintegration rate of the mask being changed during the ionic etching step. In one embodiment of the process the mask is composed of at least two layers having different disintegration rates with the layer having the highest disintegration rate being disposed adjacent the surface and the layer with the lower disintegration being disposed thereon. In another embodiment of the invention, the mask comprises a single layer of material, such as metal, and the rate of disintegration of the masking layer is changed by adding a reactive gas during a portion of the ionic etching step.

22 Claims, 4 Drawing Figures

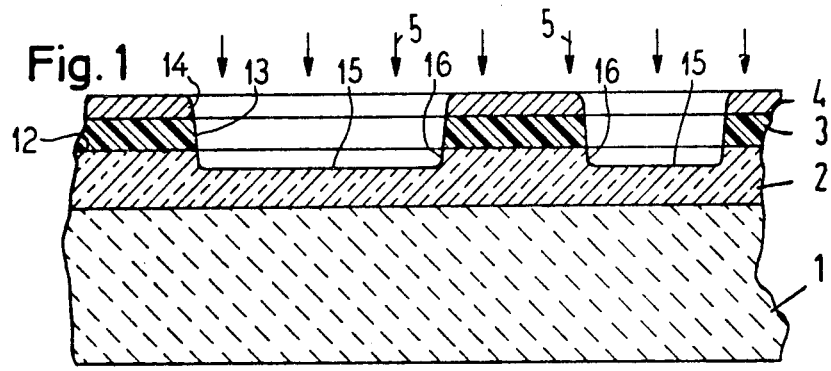
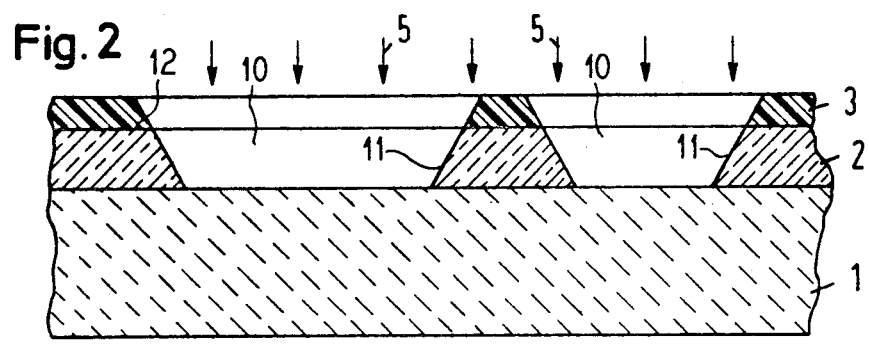
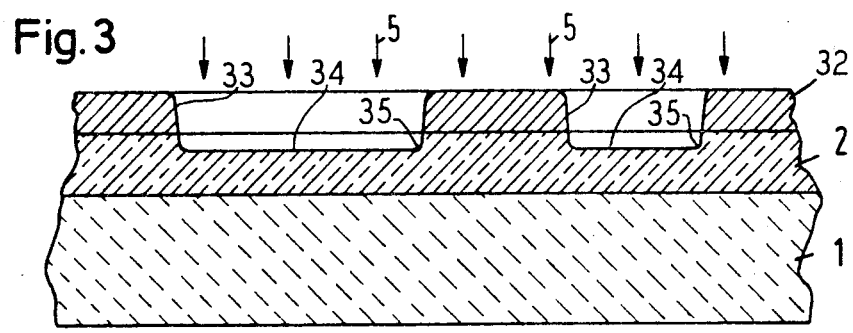
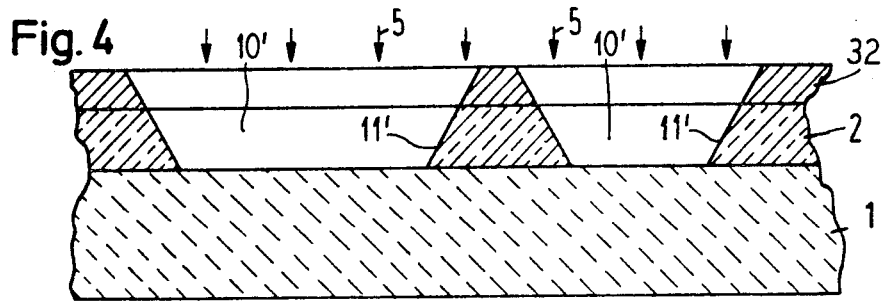

PROCESS FOR THE PRODUCTION OF ETCHED STRUCTURES IN A SURFACE OF A SOLID BODY BY IONIC ETCHING

BACKGROUND OF THE INVENTION

1. Field of the Invention

The present invention is directed to a process for the production of etched structures in a surface of solid bodies by ionic etching utilizing a mask on the surface which mask, along with the solid body, disintegrates and is removed by the ion bombardment of the ionic etching process.

2. Prior Art.

Depressions of a given form can be obtained in a surface of a solid body through bombardment with energetic ions and such a process is suggested in *Journal of Materials Science*, Vol. 4 (1969) pg. 56. In such a process, the material of the solid body is removed by virtue of atomic collision between the oncoming ions and the components of the solid body. During this process, the rate of removal of the area exposed to the ion bombardment is dependent upon factors such as the mass and energy of the ions, the mass of the components of the solid body, and upon the direction of incidence of the ion beam (see *Journal of Applied Physics*, Vol 30 (1959) pg. 1762);

In U.S. Pat. Nos. 3,860,783 and 3,839,177, etching masks are used during the ionic etching to produce a given structure in the surface of the solid body and the etching mask may be a film of photosensitive lacquier applied to a surface of the solid body. The desired pattern of the mask is obtained with a photolithographic process. The parts of the surface of the solid body which are not covered by the film of photosensitive lacquer are then etched away by the ion bombardment (ionic etching) and during the course of the ion bombardment, the edge profile or shape of the etching mask is produced in the surface of the solid body.

During ionic etching, the photosensitive lacquer etching mask is itself attacked by the ion bombardment. This attack on the mask causes the etching process to produce depressions in the surface of the solid body which depressions have faces or edge surfaces which do not extend at right angles to the surface of the solid body but have a slope of about 60° relative to the surface of the solid body. Since layers of material are subsequently applied to the etched body, this result on one hand is desired because the subsequently applied layer will adhere better to the edges that are not too steep and exhibit a better distribution of thickness than those layers disposed on edges which extend at right angles to the surface of the solid body. On the other hand, the photo lacquer mask is worn away during the ionic etching and is thus reduced in size. This reduction in the size of the mask will result in the structure being etched in the surface of the solid body by ion bombardment having a larger size or area than the corresponding structures of photo lacquer mask. This phenomena can only be compensated for to a limited extent by making dimensional allowances in the photosensitive lacquer mask because in the case of structures produced in a photosensitive lacquer coating with a photolithographic process one cannot go below a minimum distance because of diffraction phenomena arising during optical projections.

A dimensional loss in the photosensitive lacquer mask during an ionic etching process can be avoided to some extent if metallic masks are used and a reactive gas, which reduces the etching rates of the metallic mask is added to the surrounding atmosphere during the ionic etching process. However, with this solution the ionic etching will no longer produce the sloped edges of about 60° but will produce edges extending virtually at right angles to the surface being etched. This edge configuration will produce several disadvantages. For example, when the etched structure is to be subsequently uniformly coated by vapor deposition, the vapor deposited coating will often become detached at the vertical edges of the etched structure.

SUMMARY OF THE INVENTION

The present invention is directed to a process of ionic etching using a mask on the surface being etched which process produces obliquely extending edges or edges having a desired slope and which process does not have the annoying dimensional loss in relation to the original dimensions of etching mask being employed.

To accomplish these tasks, the present invention is directed to an improvement in a process for producing an etched structure in a surface of a solid body by providing a mask on the surface of the solid body, said mask leaving desired areas of the surface exposed, said solid body and said mask each being of a material that is disintegrated and removed by ion bombardment, and ionically etching said surface to remove the exposed portion. The improvement comprises increasing the disintegration rate of the mask material during a portion of the step of ionic etching.

Accordingly, the process of the present invention provides that the ionic etching, which may include directing an ion beam or sputter etching, is first carried out with an etching mask which has a disintegration rate that is small or low. Such a mask has a result that the structure produced in the surface of the solid body by the ionic etching initially is surrounded by etched faces or edge surfaces which extend at right angles to the surface of the body and the dimensions of the etch structure are identical to those of the etching mask. If the rate of disintegration of the etching mask is then increased, the edge faces or surfaces of the structure etched in the surface of the solid body are beveled by a continued ionic etching. Admittedly, the etching mask undergoes a dimensional loss during the second portion of the etching process, but the difference in dimensions caused by this dimensional loss between the ionically etched structure and the dimensions of the original etching mask is negligibly small.

In the preferred embodiment, the etching mask is formed of at least two layers each having a different disintegration rate. The layers are disposed on the surface with the layer having the higher disintegration rate being disposed directly on the surface of the solid structure and being an inner layer. The layer having the lower disintegration rate is disposed on the inner layer and is an outer layer that protects the inner layer. This arrangement of the mask produces a result that the ion bombardment first produces a structure in the surface of the solid body which structure has edge faces or surfaces that extend at right angles because the rate of removal of the solid body is substantially faster or greater than that of the etching mask. As soon as the first layer of the etching mask is worn away by the ion bombardment, the second layer of the etching mask is subjected to the ion bombardment which second layer has a rate of disintegration which is much greater. This leads to the edges of the etching mask as well as the edge surfaces of the depression produced in the surface of the solid body to become beveled. The magnitude of the angle of the bevel of the etched structure is determined by a choice of the layer thicknesses for each of the etching layers and by a selection of the disintegration rates of these layers.

In one modification of the first embodiment of the process, the etching mask is made up of one metallic layer and one layer of organic material, for example a layer of photosensitive lacquer.

In this modification, the rate of disintegration of the metallic layer is less than the rate of disintegration of the layer of the photosensitive lacquer which is the inner layer disposed directly on the surfaces of the solid body. The metallic layer is preferably formed of a metal selected from a group consisting of aluminum, titanium, chromium, manganese, molybdenum, tantalum, zirconium and vanadium.

In another modification of the first embodiment of the present invention, both the layers of the mask are made of metal which are different and have different rates of disintegration. In this modification of the layer arrangement, the metal of the highest disintegration rate is aluminum and the metal with the lower disintegration rate is selected from a group consisting of titanium, chromium, vanadium, manganese, molybdenum and tantalum. In this modification in addition, the disintegration rate of the layer having the lower disintegration rate can be reduced by adding a reactive gas to the surrounding atmosphere during the etching process. To accomplish this, it has been proven particularly expedient to add oxygen at a pressure in the range of $10^{-5}$ to $10^{-4}$ Torr to the surrounding atmosphere which in the case of disintegration by means of argon ions consist of argon gas at a pressure in a range of about $10^{-4}$ to $10^{-3}$ Torr. When such an addition is made, the change in the disintegration rate of the metal with a higher disintegration rate, for example silver, gold or aluminum, which may be the inner layer, in relation to change in disintegration rate of the metal layer with the lower disintegration rate is minimal.

In another modification of the first embodiment, which utilizes a pair of layers, a vanadium layer is disposed directly on the surface to be etched with a chromium layer applied on the vanadium layer or a manganese layer is applied directly on the surface of the solid body with a vanadium layer disposed on top of manganese layer. In these two modifications, the chromium layer and the vanadium layer when being the outer layer will have a lower disintegration rate than the respective inner vanadium layer and inner manganese layer.

In a second embodiment of the process in accordance with the present invention, a single metallic layer is used as the etching mask with the metallic layer having the desired structure to leave the desired surface portions of the solid body exposed. During the step of ionic etching, a gas that will react with the metal of the etching mask and thus reduce the etching rate of the metallic etching mask is added to the atmosphere surrounding the etching body. When the single metal layer consists of either titanium, aluminum or zirconium, oxygen has proved to be a suitable reactive gas. For example, with a surrounding atmosphere consisting of argon gas under a pressure in a range of about $10^{-4}$ to $10^{-3}$ Torr, a partial pressure of the added oxygen is in a range of about $10^{-5}$ to $10^{-4}$ Torr. In the course of the ionic etching process, the etching rate of the metal mask is then increased when the supply of reactive gas for example oxygen, is shut off. The etching rate of the metal mask will then raise and this will lead, as already described, to a flatening or beveling of the edges of the structure obtained in the surface of the solid body.

In a modification of the second embodiment, wherein a single metal layer is used as the etching mask, during the step of ion etching, a gas that will raise the disintegration rate of the single metallic layer is added to the surrounding atmosphere. When the single metal layer consists either of titanium, aluminium or zirconium, $CF_4$ has proved to be a suitable reactive gas.

BRIEF DESCRIPTION OF THE DRAWINGS

FIG. 1 is a partial cross section of a workpiece illustrating in initial step of an embodiment of the process of the present invention utilizing a mask comprising two layers;

FIG. 2 is a partial cross-sectional view of the workpiece of FIG 1 after removal of the outermost layer of the mask;

FIG. 3 is a partial cross-sectional view of a workpiece having a mask comprising a single metal layer during an initial portion of the process in accordance with the present invention; and FIG. 4 is a partial cross-section view of the workpiece of FIG. 3 during the end of the process in accordance with the present invention.

DESCRIPTION OF THE PREFERRED EMBODIMENT

The principles of the present invention are particularly useful in a process for producing an etched structure, which has openings or apertures 10, in a solid body 2. As illustrated in FIG. 2, the openings of the etched structure have faces or side surfaces 11 which extend at an angle to an upper surface 12 of the body 2.

In the illustrated embodiment of FIGS. 1 and 2, the etched structure with apertures 10 is formed in a solid body 2 which comprises a silicon dioxide coating or layer which has been applied on a substrate 1 of silicon. To perform the process of the present invention, the surface 12 of the silicon dioxide coating 2 is covered with a layer or coating of a photosensitive lacquer which is subsequently exposed and developed to produce an inner mask layer 3 which has a given pattern remaining on the silicon dioxide coating 2 and has openings or apertures 13 to expose the desired areas of the surface 12. A metal layer, for example titanium, is vapor deposited on the mask layers of the photo lacquer. This titanium coating 4 is then chemically etched by another operation which may involve a photolithographic process so that an outer mask layer 4 of titanium remains on the photo lacquer layer 3. The outer layer 4 covers the photo lacquer layer 3 and has openings or apertures 14 which match the pattern of the opening 13 of the layer 3.

While the masks formed by the layers 3 and 4 are illustrated as utilizing a photo lacquer layer as the inner layer 3 and a metal layer as the outer layer 4, two metal layers may be used. In such a process, a double metal layer mask is produced by using a lifting technique.

The solid body 2 provided with a mask comprising the layers 3 and 4 is then subjected to an ionic etching process which may be either by subjecting the mask and the exposed portions of the body 2 to ion beams 5 or by utilizing a sputter etching operation which is carried out with a carrier gas, for instance argon. As a result of the ionic etching which will be performed at subatmospheric pressure, the silicon dioxide coating is worn away in the surface areas that are exposed by the openings 13, 14 and similarly the metal layer 4 of the mask is also worn away but at a considerably slower rate than the rate of removal of silicon dioxide coating. In this way, initial depressions 15 (FIG. 1) which are produced in the silicon dioxide coating 2 will have surfaces surrounding faces or edge surfaces 16 which extend almost at right angles to the surface 12.

In the ionic etching process, electrically accelerated argon ions are used which will have kinetic energy of between 200 and 1200 eV. When a sputtering etching process is used, the high frequency voltage applied will be between 500 and 2000v. When using a beam of argon ions which have an intensity or density of about $10^{15}$ ions per cm$^2$, per second and have a kinetic energy of 600 eV, a period of about ½hour is needed to remove the SiO$_2$ coating having a thickness of 0.5 μm. When the ions have been removed, the outer metal layer 4 of the etching mask, which layer may be a titanium coating of a thickness of 0.1 μm, the layer 3, which is either the photo lacquer layer 3 or a metal layer such as aluminum, if a metal layer was used beneath the titanium layer 4, will be exposed. With the exposing of the layer 3, the edge surface of the openings 13 and the edge faces or side surfaces of the depression 10 being formed will be beveled as the ionic etching continues to produce the sloping surface 11.

As illustrated in FIG. 1, the initial depressions 15 will have substantially the same shape and size as the openings 13. While the finished openings 10 of the etch structure will have the beveled or sloping edge surface 11 (FIG. 2), the dimensions of the openings 10 adjacent the substrate 1 are substantially the same as the intital dimensions of the opening 13 in the layer 3.

In this embodiment, the layer 3 has a higher disintegration rate than the layer 4. As pointed out hereinabove, the two layers 3 and 4 can both be metal layers in which the metal of the layer 3 has a higher disintegration rate than the metal selected for the layer 4. Also, the atmosphere surrounding the surface during the ionic etching can include a reactive gas which will decrease the rate of disintegration of the metal layer 4.

In a second embodiment of the present invention, a single metal layer is applied on the surface 12 of the solid body 2 such as a silicon dioxide layer. The layer 32 is processed to produce a single layer mask 32 having opening 33. During the ion etching process, a reactive gas is added to the atmosphere surrounding the workpiece to vary the rate of disintegration of the metal of the mask 32. As illustrated in FIG. 3, the reactive gas is added to the atmosphere surrounding the workpiece during the ionic etching process and reduces the rate of disintegration of the layer 32 so that the ion beams 5 will produce depression 34 having the edge surfaces 35 that extend substantially at right angles to the surface 12 of the solid body 2. After the depressions 34 have been etched to a desired depth, the supply of the reactive gas is either interrupted or stopped so that the rate of disintegration of the layer 32 increases to allow beveling of the edges of both the openings 33 and the depression (FIG. 4) to produce opening 10' with sloping edges 11'. As in the first embodiment, the dimensions of the opening 10' are substantially the same as the initial dimensions of the opening 33.

Although various minor modifications may be suggested by those versed in the art, it should be understood that I wish to employ within the scope of the patent granted hereon, all such modifications as reasonably and properly come within the scope of my contribution to the art.

I claim:

1. In a process for producing an etched structure in the surface of the solid body by providing a mask on the surface of the solid body, said mask leaving desired areas of the surface exposed, said solid body and said mask each being of a material that is disintegrated and removed by ion bombardment, and ionic etching said surface to remove the exposed portions, the improvement comprising increasing the disintegration rate of the mask material during a portion of the step of ionic etching.

2. In a process according to claim 1, wherein the step of increasing the rate of disintegration of the mask comprises providing a mask comprising at least two layers with each layer having a different disintegration rate and with the layer with the higher disintegration rate being disposed directly on the surface of the solid body with the other layer disposed thereon so that as the outer layer of the mask is removed to expose the layer directly on the surface, the rate of disintegration of the mask material increases.

3. In a process according to claim 2, wherein the outer layer with the lower disintegration rate is a metal layer.

4. In a process according to claim 3, wherein the innermost layer with the higher disintegration rate consists of an inorganic material, in particular a photosensitive lacquer.

5. In a process according to claim 4, wherein the metal layer utilizes a metal selected from a group consisting of aluminum, titanium, chromium, manganese, molybdenum, tantalum, zirconium and vanadium.

6. In a process according to claim 2, wherein the layer with the higher disintegration rate consists of aluminum and the other layer consists of a metal selected from a group consisting of titanium, chromium, vanadium, manganese, molybdenum and tantalum.

7. In a process according to claim 6, which includes providing a reactive gas to lower the disintegration rate of the outer layer.

8. In a process according to claim 7, wherein the reactive gas is oxygen.

9. In a process according to claim 8, wherein the oxygen has a partial pressure in the range of between $10^{-5}$ and $10^{-4}$ Torr.

10. In a process according to claim 7, wherein the reactive gas in CF$_4$.

11. In a process according to claim 1, wherein the mask is a single layer of metal and wherein the step of changing the disintegration rate of the masking material comprises adjusting the etching rate of the metallic coating by selectively adding a reactive gas to the surrounding atmosphere.

12. In a process according to claim 11, wherein the reactive gas is oxygen.

13. In a process according to claim 11, wherein the reactive gas is CF$_4$.

14. In a process according to claim 11, wherein the metal of the layer is selected from a group consisting of aluminum, titanium, molybdenum, manganese, tantalum, zirconium and vanadium.

15. In a process according to claim 14, wherein the reactive gas is oxygen.

16. In a process according to claim 14, wherein the reactive gas is $CF_4$.

17. In a process according to claim 11, wherein the reactive gas is supplied to the atmosphere during the initial portion of the step of ion bombardment to lower the disintegration rate of the metal layer and subsequently the supply of reactive gas is shut off.

18. In a process according to claim 17, wherein the reactive gas is oxygen.

19. In a process according to claim 17, wherein the reactive gas is oxygen and the oxygen is supplied to the surrounding atmosphere at a partial pressure in a range of $10^{-5}$ to $10^{-4}$ Torr.

20. In a process according to claim 17, wherein the metal of the layer is selected from a group consisting of aluminum, titanium, molybdenum, manganese, tantalum, zirconium and vanadium.

21. In a process according to claim 11, in which the increase in the rate of disintegration of the metal layer is caused by the addition of a reactive gas that raises the disintegration rate of the metal layer.

22. In a process according to claim 21, wherein the reactive gas is $CF_4$.

* * * * *